US 9,054,699 B2

(12) United States Patent
Iwama

(10) Patent No.: US 9,054,699 B2
(45) Date of Patent: Jun. 9, 2015

(54) SWITCHING DEVICE OF SEMICONDUCTOR CIRCUIT AND SWITCHING METHOD OF THE SAME

(71) Applicant: FUJITSU LIMITED, Kawasaki-shi, Kanagawa (JP)

(72) Inventor: Masahiro Iwama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 265 days.

(21) Appl. No.: 13/871,516

(22) Filed: Apr. 26, 2013

(65) Prior Publication Data
US 2013/0234777 A1 Sep. 12, 2013

Related U.S. Application Data

(63) Continuation of application No. PCT/JP2010/069357, filed on Oct. 29, 2010.

(51) Int. Cl.
*G06F 11/16* (2006.01)
*H03K 19/003* (2006.01)
*H03K 17/14* (2006.01)
*H03K 17/18* (2006.01)

(52) U.S. Cl.
CPC ............... *H03K 17/14* (2013.01); *H03K 17/18* (2013.01)

(58) Field of Classification Search
CPC ............................... H03K 17/14; H03K 17/18
USPC .................. 327/526; 326/10; 714/3; 716/100
See application file for complete search history.

(56) References Cited

U.S. PATENT DOCUMENTS

| 6,879,207 B1* | 4/2005 | Nickolls ........................ 327/526 |
| 8,312,300 B2* | 11/2012 | Domingo et al. ............. 713/300 |
| 2009/0091993 A1* | 4/2009 | Ozeki ............................ 365/200 |

FOREIGN PATENT DOCUMENTS

| JP | 09-162359 A | 6/1997 |
| JP | 2003-078018 A | 3/2003 |
| JP | 2004-311608 A | 11/2004 |
| JP | 2004-340877 A | 12/2004 |
| JP | 2006-174132 A | 6/2006 |

OTHER PUBLICATIONS

International Search Report of PCT/JP2010/069357, mailing date of Nov. 30, 2010.
Notification of Transmittal of Translation of the International Preliminary Report on Patentability (PCT/IB/338) of the International Application No. PCT/JP2010/069357 mailed Jun. 13, 2013 with forms PCT/IB/373 and PCT/ISA/237.

* cited by examiner

*Primary Examiner* — Kenneth Wells
(74) *Attorney, Agent, or Firm* — Westerman, Hattori, Daniels & Adrian, LLP

(57) ABSTRACT

Each of a plurality of redundantly formed semiconductor circuits integrally has a monitor transistor and is energized by being supplied with an enable signal. A monitor circuit associated with each semiconductor circuit detects a collector current of the monitor transistor and, when the collector current is less than a predetermined threshold value, outputs an alarm signal. A variation predicting circuit calculates the rate of change per unit time with respect to the collector current. An order determining circuit stores the identification numbers of the semiconductor circuits into an order determination register in descending order of the rate of change. The order determination register initially outputs the front identification number, and thereafter outputs the respective following identification number each time a respective one of the monitor circuits outputs an alarm signal. A semiconductor circuit selection decoder supplies an enable signal to the semiconductor circuit indicated by an identification number.

4 Claims, 12 Drawing Sheets

SWITCHING DEVICE OF SEMICONDUCTOR CIRCUIT AND SWITCHING METHOD OF THE SAME

CROSS-REFERENCE TO RELATED APPLICATION

This application is a continuation application of International Application PCT/JP2010/069357, filed on Oct. 29, 2010, and designated the U.S., the entire contents of which are incorporated herein by reference.

FIELD

The present invention relates to a switching technology of a semiconductor circuit.

BACKGROUND

A device composed of a compound semiconductor is excellent of fastness but is, on the other hand, short of a life-time enabled to exhibit predetermined performance because of having a property of changing with a lapse of time. A similar problem could arise also in elements composed of materials such as silicon other than compounds. This being the case, an examination of a configuration of making the elements redundant gets underway, which enables an operation of an electronic system using these elements to continue even when the element being set active initially gets unusable due to expiration of its life-time. A general type of redundant configuration is that when the life-time of the element being set active initially expires, a switching device hands over its operation to a standby element by electrifying the standby element.

DOCUMENTS OF PRIOR ARTS

Patent Document

[Patent document 1] Japanese Patent Application Laid-Open Publication No. 2004-311608

SUMMARY

A time-lapse fluctuation of the element, however, occurs also due to heat, and hence it follows that the standby element becomes deteriorated even when not electrified due to the heat emitted by circuit elements peripheral to the active element etc. Then, as illustrated in FIG. 11, a tendency is that a deterioration speed of the element is slower when not electrified than when electrified; (A) the deterioration speed at the non-electrifying time is fast if the deterioration speed at the electrifying time is fast; and (B) the deterioration speed at the non-electrifying time is slow if the deterioration speed at the electrifying time is slow. Dispersion in progress speed of the deterioration of the element, however, occurs per individual element, and it might therefore happen that the deterioration speed of the standby element at the non-electrifying time becomes approximate to the deterioration speed of the active element being electrified. None of this type of deterioration of the element at the non-electrifying time has hitherto been taken into consideration on the occasion of making the elements redundant. Therefore, as depicted in FIG. 12, such a situation could arise that the life-time of the standby element (exhibiting the characteristic of the deterioration speed being fast as illustrated in FIG. 11(A)) is on the verge of reaching its expiration at a point of time when the life-time of the active element (exhibiting the characteristic of the deterioration speed being slow as illustrated in FIG. 11(B)) reaches its expiration.

According to an aspect of the embodiments, each of a plurality of redundantly-configured elements switched over by a switching device or a switching method includes an integrally formed monitor unit. Then, a unit for implementing the switching device or the switching method according to the present invention electrifies the top element in an initial status according to the order of the respective elements, which is set in the sequence from the largest down to the smallest in variation of a physical characteristic measured with respect to each monitor unit. Thereafter, the unit for implementing the switching device or the switching method according to the present invention measures the physical characteristic of each monitor unit and outputs a switching signal when a relationship in magnitude between a value of the measured physical characteristic and a predetermined threshold value is reversed. The unit for implementing the switching device or the switching method according to the present invention, whenever thus outputting the switching signal, stops electrifying the element electrified so far and electrifies the element that is next in the order thereof.

The object and advantages of the invention will be realized and attained by means of the elements and combinations particularly pointed out in the claims.

It is to be understood that both the foregoing general description and the following detailed description are exemplary and explanatory and are not restrictive of the invention.

EMBODIMENTS

Embodiments of an apparatus for and a method of switching over a redundantly configured element (redundant element) will hereinafter be described. An example that will be described below is an example of using a semiconductor circuit composed of a compound semiconductor, of which a speed of fluctuation with a lapse of time is higher than a semiconductor circuit composed of a silicon semiconductor. According to an existing semiconductor circuit manufacturing process, a multiplicity of semiconductor circuit patterns is formed simultaneously in a way that employs the same material by use of a photolithography technique on one single wafer, and each portion formed with the semiconductor circuit pattern is cut out as a semiconductor circuit chip. Accordingly, characteristics of time-lapse fluctuations (tendencies of the time-lapse fluctuations when electrified and when not electrified) of the respective semiconductor circuits formed on the same wafer and of the respective circuit elements (a transistor, a diode, a resistance, etc) configuring the same semiconductor circuit, are the same. On the other hand, it follows that a difference occurs between the characteristics of time-lapse fluctuations among the semiconductor circuits cut out of another wafer, depending on a subtle difference between qualities of the materials and also a subtle difference between the semiconductor circuit manufacturing processes.

Figure 1:
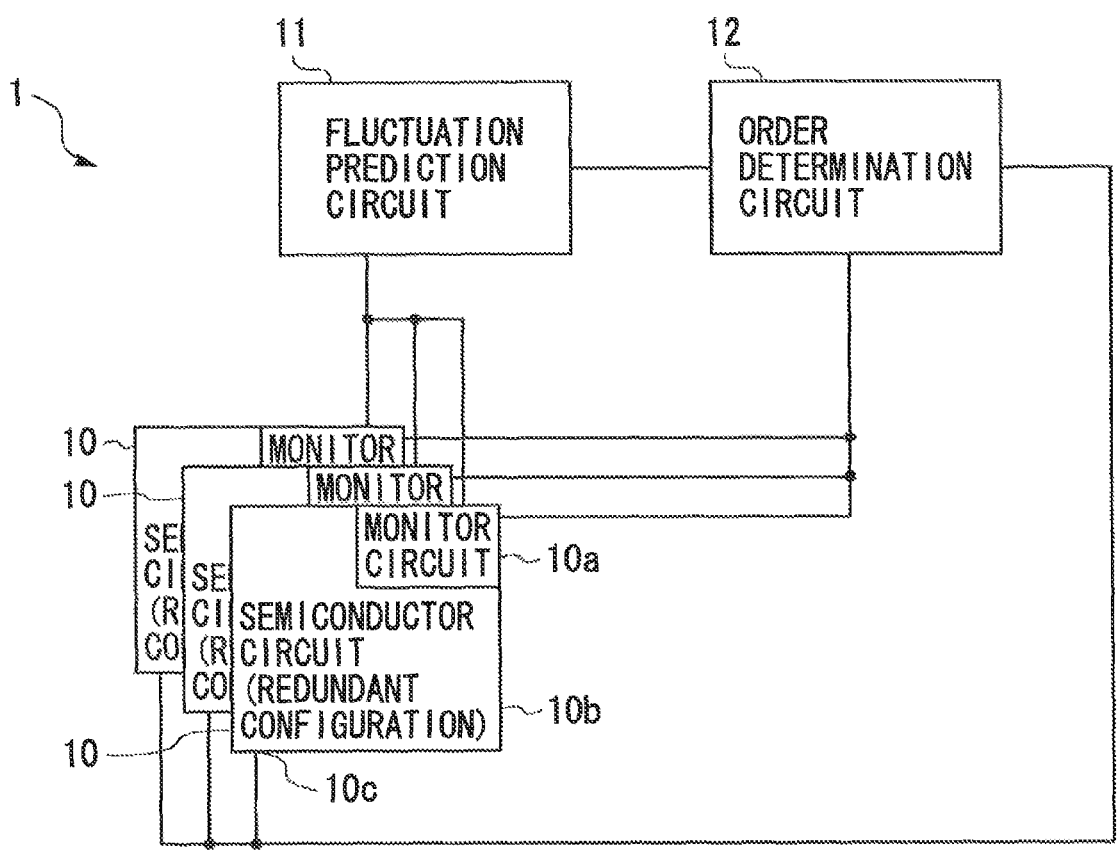
FIG. 1 is a block diagram illustrating a schematic configuration of a switching device of elements taking a redundant configuration.
Figure 6:
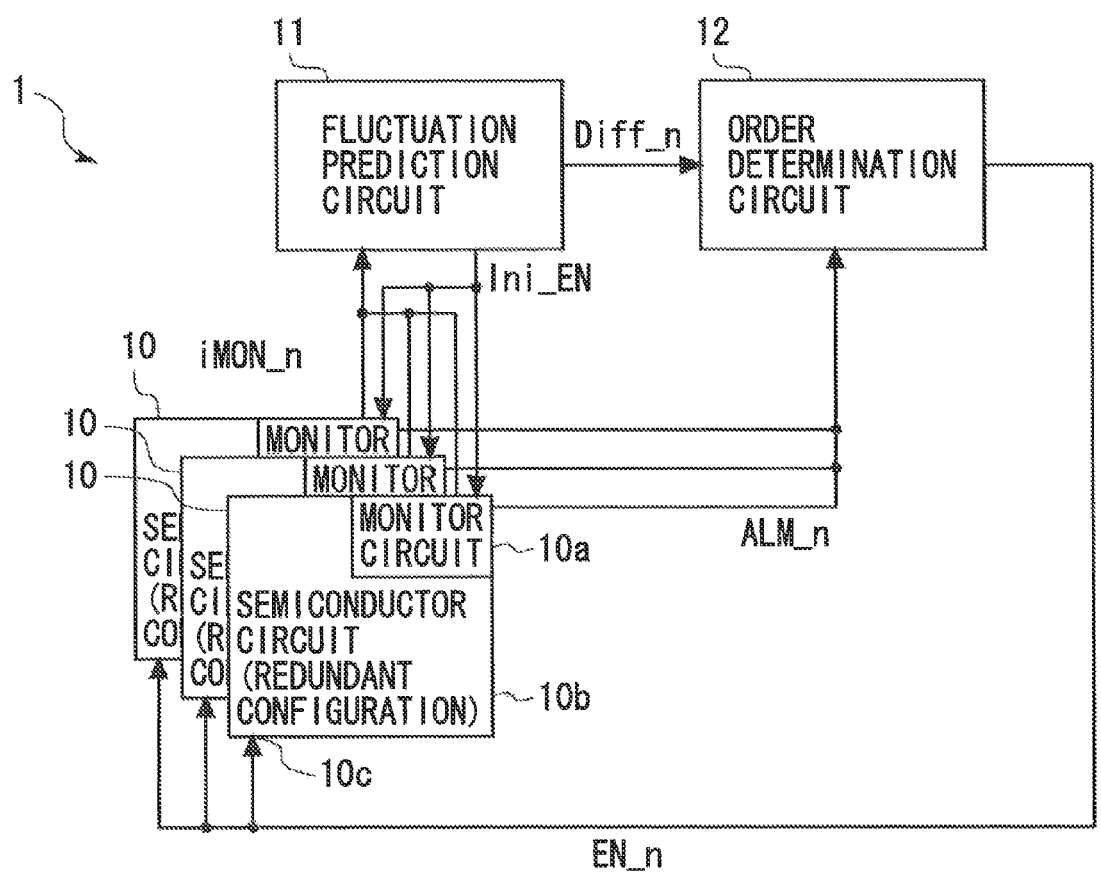
FIG. 6 is a signal diagram illustrating a flow of signals in FIG. 1.

FIG. 1 is a schematic block diagram illustrating an electronic system 1 including a plurality (n-pieces, e.g., three pieces in FIG. 3) of built-in semiconductor circuits 10 having the same configuration as the redundant element. Further, FIG. 6 is a signal diagram illustrating a flow of signals in FIG. 1.

As illustrated in FIG. 1, a part of each redundant semiconductor circuit 10 is formed integrally with a monitor circuit 10a. Namely, the circuits (FIGS. 2 and 3) building up the monitor circuit 10a are integrally formed by the same semiconductor manufacturing process as a main unit 10b of the semiconductor circuit 10 is formed. Herein, the main unit 10b of the semiconductor circuit 10 represents the unit excluding the monitor circuit 10a in the semiconductor circuit 10. However, the monitor circuit 10a and the main unit 10b are, though functioning independently of each other, supplied with electricity from a power source in common. That is, as depicted in FIG. 6, the monitor circuit 10a and the main unit 10b are electrified during only a period for which enable signals (EN) are supplied to an enable terminal 10c but are in a non-electrified status during a period for which the enable signals (EN) are not supplied. Accordingly, the enable signals (EN) are supplied selectively to the respective semiconductor circuit s10, thereby enabling the main units 10b of the semiconductor circuit s10 to be used in the way of being sequentially switched over. Note that "n" attached to the symbol (EN) indicating the enable signal illustrated in FIG. 6 notates a numerical value representing an identification number of the semiconductor circuit related to this enable signal and is determined from a connection relationship of wires. The meaning of the symbols "n" is the same with "iMON_n", "ALM_n" in FIG. 6 etc and "Diff_n" in FIG. 9 etc.

The monitor circuit 10a of each semiconductor circuit is a circuit to output a voltage signal (iMON_n) that changes depending on the time-lapse fluctuation and to output an alarm signal (ALM_n) indicating that a life-time of the main unit 10b of the semiconductor circuit 10 expires by comparing this voltage signal with a threshold value.

Figure 2:
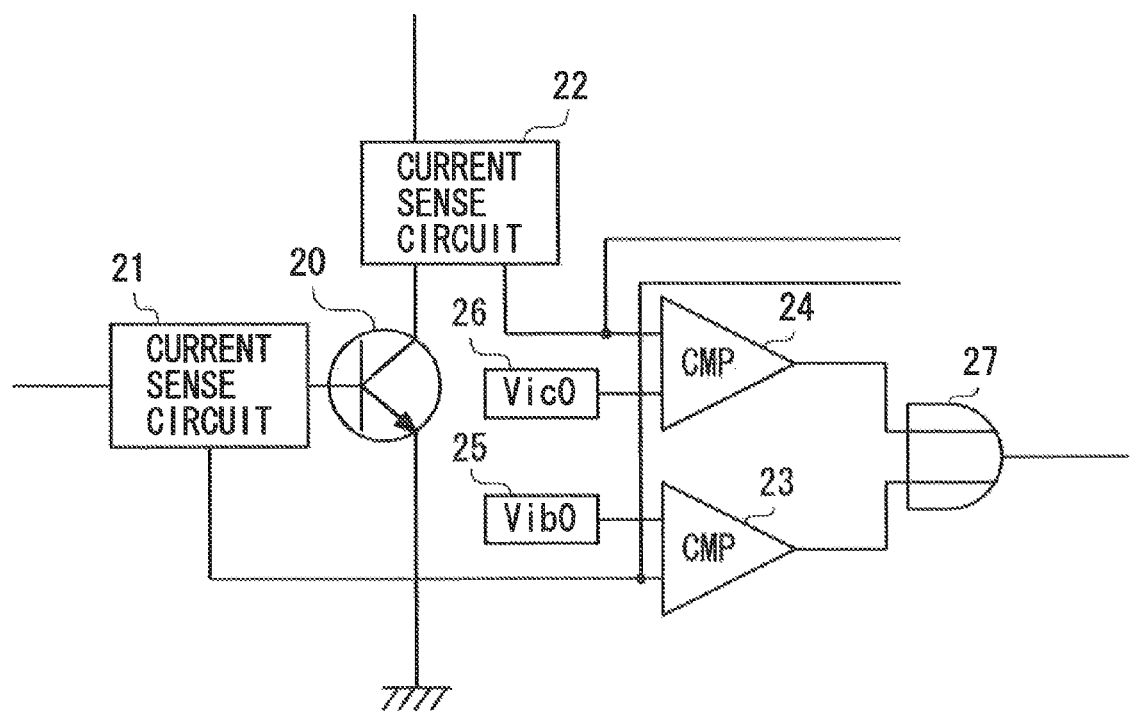
FIG. 2 is a logical circuit diagram illustrating a detailed configuration of a monitor circuit.
Figure 7:
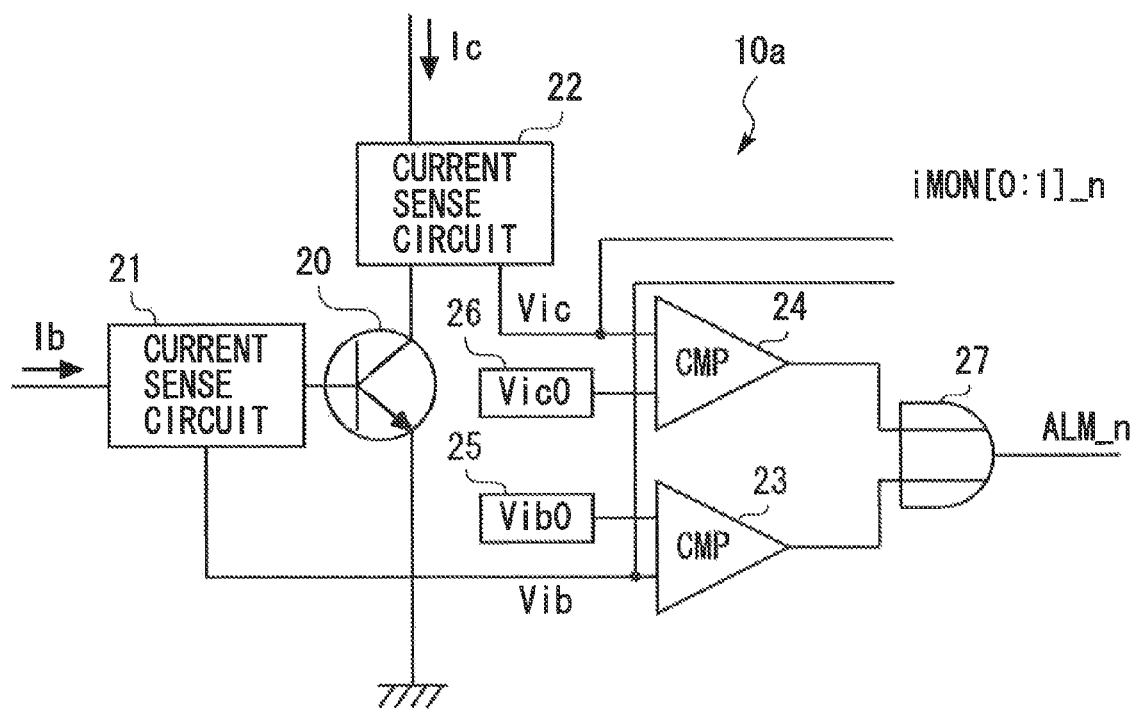
FIG. 7 is a signal diagram illustrating a flow of signals in FIG. 2.

FIG. 2 is a block diagram illustrating a circuit configuration of the monitor circuit 10a, and FIG. 7 is a signal diagram depicting a flow of the signals in FIG. 2.

In FIG. 2, a monitor transistor 20 is an npn-type bipolar transistor and is one example of the monitor unit. A base terminal of the monitor transistor 20 is connected to the unillustrated power source provided outside the semiconductor circuit via a base current sense circuit 21, while a collector terminal thereof is connected thereto via a collector current sense circuit 22, respectively. A voltage of the power source is well larger than a voltage VBE (a voltage between the base and the emitter) of the monitor transistor 20 even when subtracting a voltage drop in the base current sense circuit 21, and hence a base current Ib exhibiting a known characteristic of exponential function flows to the base terminal of the monitor transistor 20. Moreover, a collector current Ic having a magnitude given by multiplying a value of the base current Ib by a DC amplification ratio hFE of the monitor transistor 20 flows to the collector terminal of the monitor transistor 20 via the collector current sense circuit 22. The time-lapse fluctuation of the compound semiconductor material composing the semiconductor circuit 10 appears mainly in a decrease of the DC amplification ratio hFE. That is, when the time-lapse fluctuation of the compound semiconductor material gets progressed and if based on the premise that the voltage of the power source is fixed, the base current Ib is restricted to a slight amount of decrease, however, the collector current Ic decreases to a greater degree than the base current Ib. Accordingly, a numerical value representing a degree of the time-lapse fluctuation can be acquired by calculating a ratio (hFE) between the base current Ib and the collector current Ic.

Figure 3:
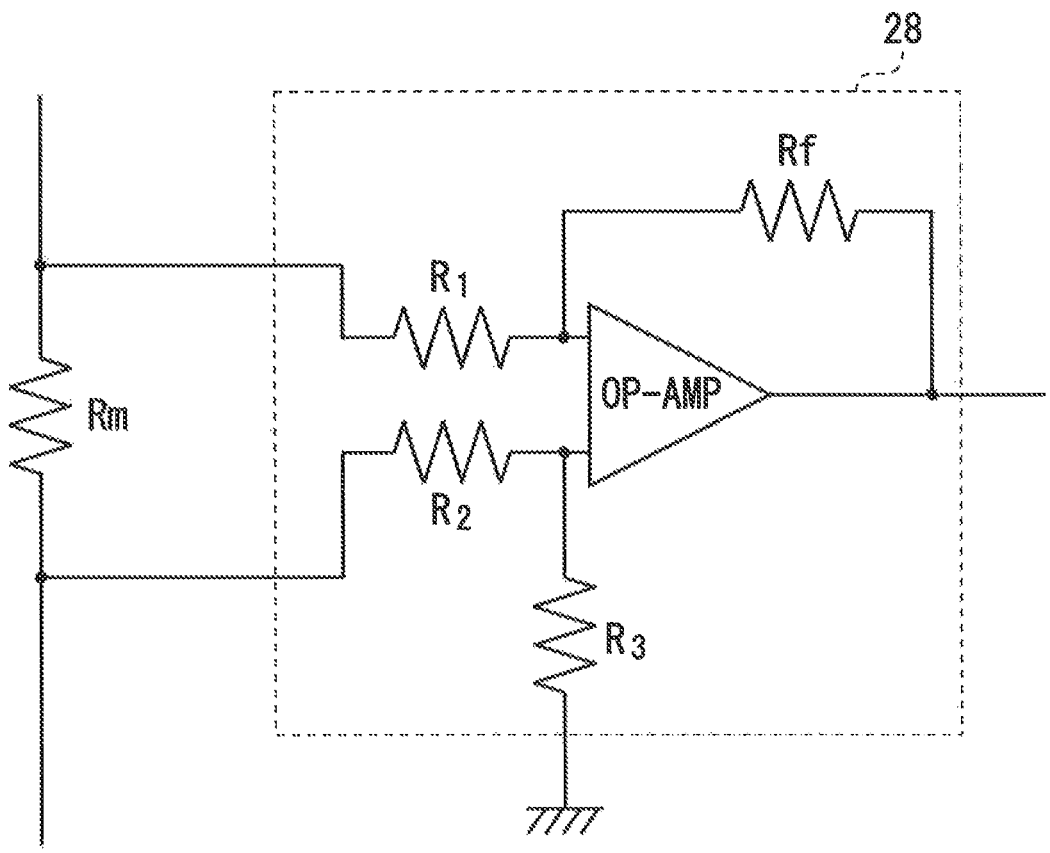
FIG. 3 is a circuit diagram illustrating a detailed configuration of a current sense circuit.

FIG. 3 is a circuit diagram illustrating specific circuit configurations of the respective current sense circuits 21, 22. In FIG. 3, a symbol "Rm" represents a resistance interposed midway of the electrical wire via which the measurement target currents Ib, Ic flow, and therefore a potential difference proportional to the measurement target currents Ib, Ic flows to between both terminals of the resistance Rm. Such being the case, a subtractor 28 outputs a potential difference Vix (=V1−V2) on the basis of electric potentials (an electric potential V1 before the voltage drop and an electric potential V2 after the voltage drop) at the both terminals of the resistance Rm.

Referring back to FIG. 2, outputs Vib, Vic of the two current sense circuits 21, 22 are inputted as monitor signals iMON[k]_n to a fluctuation prediction circuit 11. Herein, "k" is 0 or 1, in which "k=0" connotes Vib, and "k=1" connotes Vic. Note that a value given in the case of "k=0" and a value given in the case of "k =1" are notated together as iMON[0:1]_n as the case may be. Further, the output Vib of the base current sense circuit 21 is inputted also to an inverted input terminal of a comparison circuit 23, and the output Vic of the collector current sense circuit 22 is inputted also to an inverted input terminal of a comparison circuit 24. A threshold voltage generation circuit 25 inputs, to a non-inverted input terminal of the comparison circuit 23, the voltage Vib as a threshold voltage, which is proportional to the base current Ib, in such a case that the main unit 10b is disabled from normally operating due to the progress of the time-lapse fluctuation of the semiconductor circuit. Similarly, a threshold voltage generation circuit 26 inputs, to a non-inverted input terminal of the comparison circuit 24, the voltage Vic as the threshold voltage, which is proportional to the collector current Ic, in such a case that the main unit 10b is disabled from normally operating due to the progress of the time-lapse fluctuation of the semiconductor circuit 10. Accordingly, as the time-lapse fluctuation of the semiconductor circuit 10 gets progressed, the two potential differences Vib and Vic drop down and, when eventually reaching a status where the main unit 10b is disabled from normally operating, decrease under the threshold voltages corresponding thereto, respectively. Thereupon, H-level signals are output from respective comparators 23, 24 and are further output as alarm signals ALM_n via an OR circuit 27.

It is to be noted that the circuit elements other than the monitor transistor 20 in the respective circuit elements building up the monitor circuit 10a described above may be composed of materials exhibiting a less of time-lapse fluctuation in order to measure the time-lapse fluctuation exactly. Therefore, the monitor transistor 20 is composed of the compound semiconductor material integrally with the semiconductor circuit 10, while other circuit elements are composed of the materials exhibiting a less of the time-lapse fluctuation, e.g., the silicon semiconductor materials and may also be externally attached to the semiconductor circuit 10.

Figure 4:
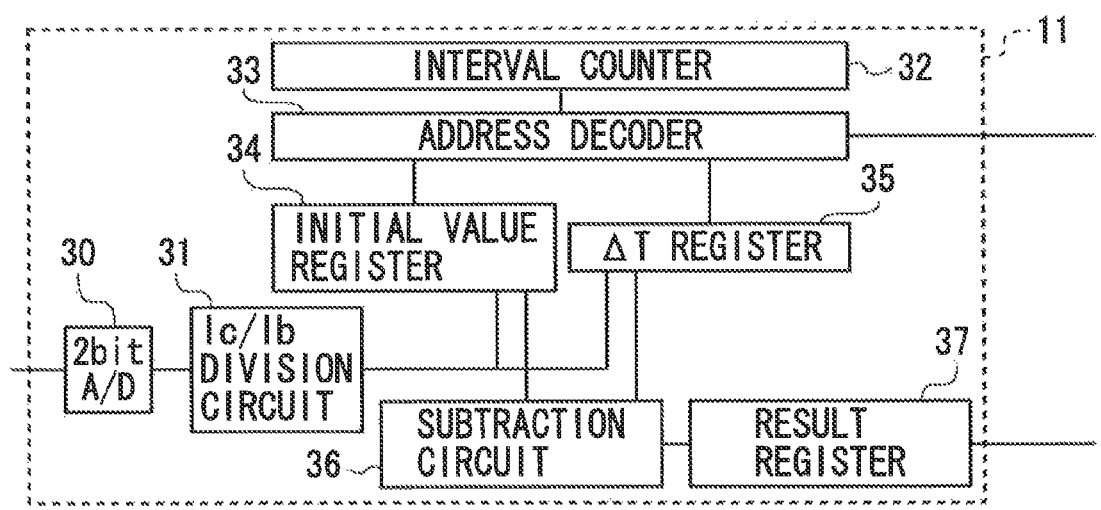
FIG. 4 is a block diagram illustrating a detailed configuration of a fluctuation prediction circuit.
Figure 8:
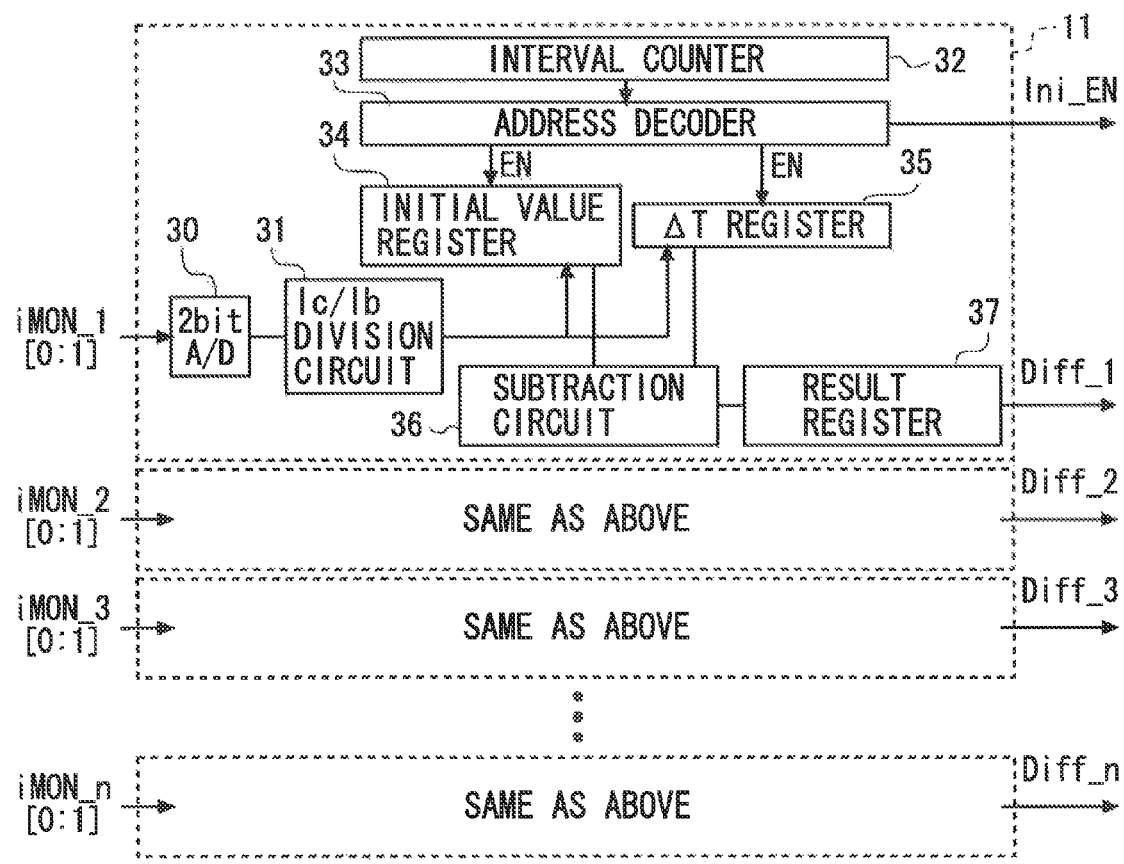
FIG. 8 is a signal diagram illustrating a flow of signals in FIG. 4.

Referring back to FIG. 1, the monitor signal iMON[0:1]_n output from the monitor circuit 10a of each semiconductor circuit 10 is inputted to the fluctuation prediction circuit 11. The fluctuation prediction circuit 11 is a circuit that functions when the main power source of the electronic system 1 is powered ON for the first time, and sequentially supplies the fluctuation prediction circuit 11 with the signal Diff_n for initially setting an order determination register 41 of an order determination circuit 12 that will be described later on. As illustrated in FIG. 8, n-pieces of fluctuation prediction circuit 11 are provided corresponding to the respective semiconductor circuits 10. As depicted in FIG. 4, each fluctuation prediction circuit 11 includes an A/D converter 30, a division circuit 31, an interval counter 32, an address decoder 33, an initial value register 34, a ΔT register 35, a subtraction circuit 36 and a result register 37.

The A/D converter 30 converts a pair of analog monitor signals iMON[0:1]_n output from the monitor circuit 10a of the corresponding semiconductor circuit 10 into digital signals.

The division circuit 31 calculates a ratio between the pair of monitor signals iMON[0:1]_n converted into the digital signals. Namely, the division circuit 31 calculates an amplification ratio (hFE=Ic/Ib) of the monitor transistor 20 configuring the monitor circuit 10a of the corresponding semiconductor circuit 10.

The interval counter 32 starts counting (a lapse of time) since a point of time when the main power source of the electronic system 1 is powered ON for the first time, and inputs a count value corresponding to the lapse of time since this point of time to the address decoder 33.

The address decoder 33 decodes and thus converts the inputted count value into an address value, and outputs the enable signal EN to the initial value register 34 at timing with the address value being an initial value (#0). Further, the address decoder 33, when the address value reaches a predetermined value (#N) after a lapse of the predetermined time (ΔT) since the enable signal EN has been output to the initial value register 34, outputs the enable signal EN to the ΔT register 35. Moreover, the address decoder 33 inputs an enable signal (Ini_EN) to each semiconductor circuit 10 for a fixed period (i.e., a period till the address value increases slightly over the predetermined value #N) since the timing when the address value is the initial value (#0). As a result, all of the semiconductor circuits 10 operate for the fixed period till the address value increases slightly over the predetermined value #N since the timing when the address value is the initial value (#0), and hence actually measured values for predicting the fluctuation can be acquired substantially under the same condition.

The initial value register 34 gets stored with the value (hFE) of the amplification ratio inputted from the division circuit 31 at a point of time when the enable signal EN is inputted from the address decoder 33. Similarly, the ΔT register 35 gets stored with the value (hFE) of the amplification ratio inputted from the division circuit 31 at the point of time when the enable signal EN is inputted from the address decoder 33.

The subtraction circuit 36 subtracts the value (hFE) of the amplification ratio stored in the ΔT register 35 from the value (hFE) of the amplification ratio stored in the initial value register 34, thereby storing the result register 37 with the value Diff_n indicating a magnitude of a fluctuation quantity of the time-lapse fluctuation for the time ΔT.

The result register 37 continues to, as far as the fluctuation prediction circuit 11 functions, retain and output the once-stored value Diff_n. The current sense circuits 21, 22 in each monitor circuit 10a and the fluctuation prediction circuit 11, which have been described so far, are given by way of one example of a variation measurement circuit.

Figure 5:
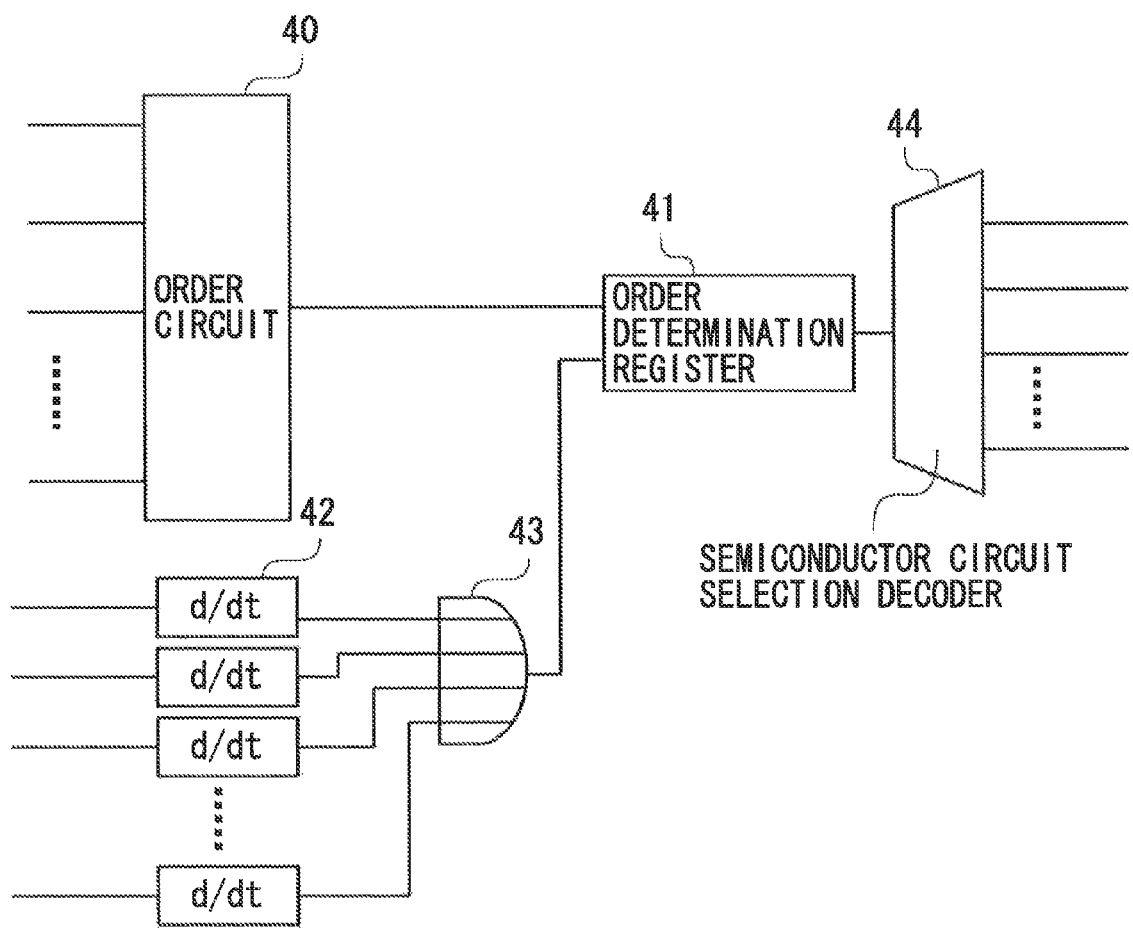
FIG. 5 is a logical circuit diagram illustrating a detailed configuration of an order determination circuit.
Figure 9:
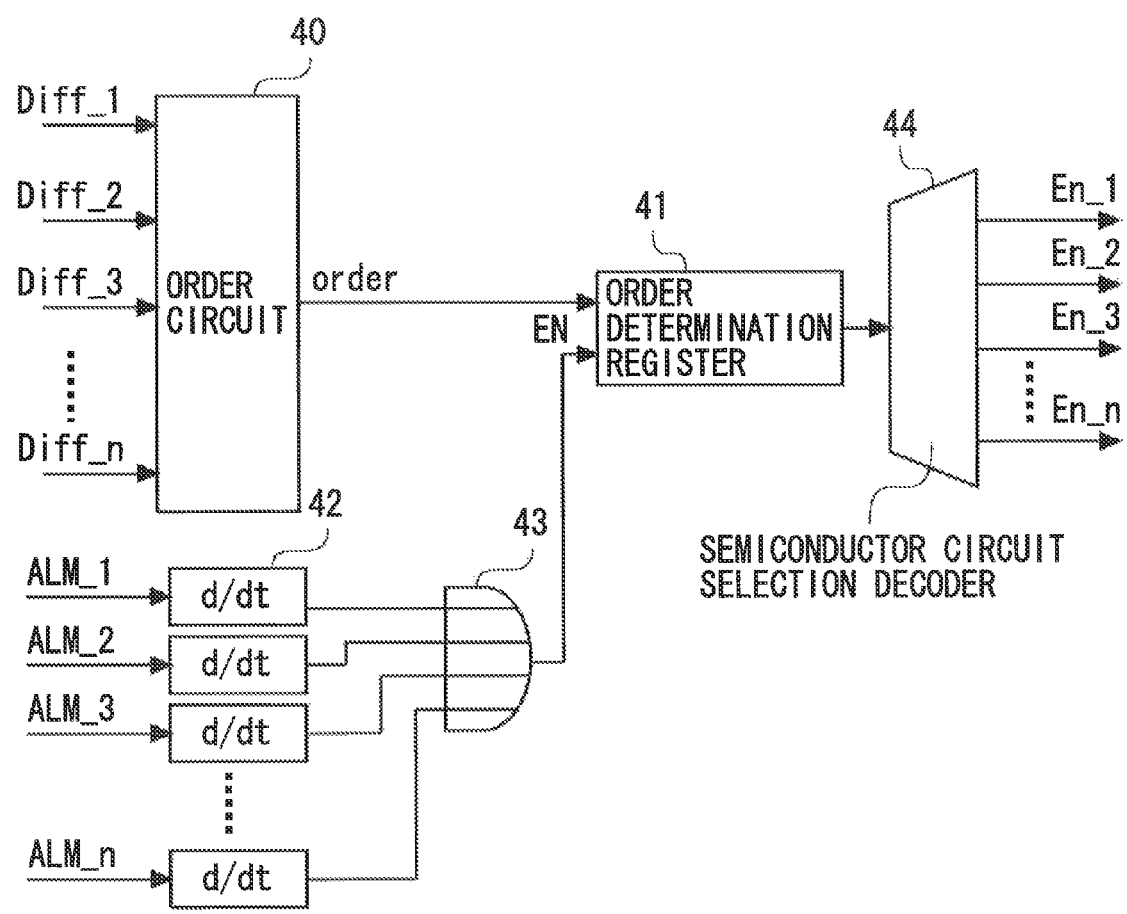
FIG. 9 is a signal diagram illustrating a flow of signals in FIG. 5.
Figure 10:
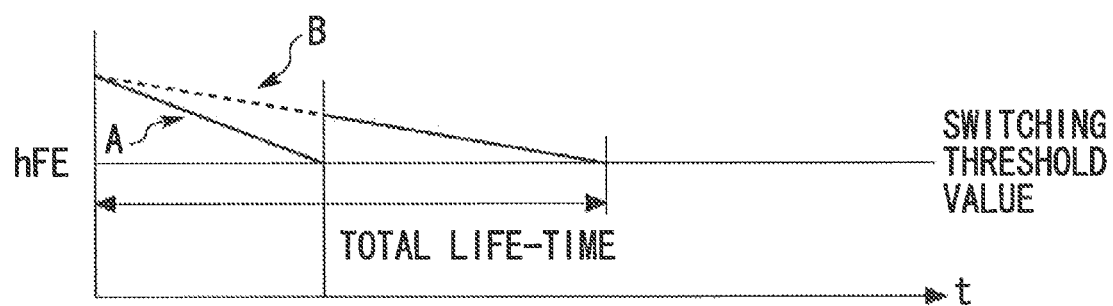
FIG. 10 is a graph depicting transitions of time-lapse fluctuations of two elements when not electrified and when electrified.

Referring back to FIG. 2, the order determination circuit 12 is a circuit that determines, based on a correlation between the magnitudes of the values Diff_n output from the respective fluctuation prediction circuits 11, a switching order of the individual semiconductor circuits 10 and switches over the active semiconductor circuit 10 each time the alarm signal ALM_n is output from the monitor circuit 10a of each semiconductor circuit 10. As depicted in FIG. 5, the order determination circuit 12 includes an order circuit 40, a differentiating circuit 42 provided per semiconductor circuit 10, an OR circuit 43, the order determination register 41 and a semiconductor circuit selection decoder 44. Incidentally, FIG. 9 is a signal diagram illustrating the signals that are inputted and output to the respective circuits building up the order determination circuit 12.

The order circuit 40 is a priority encoder that compares the magnitudes of the values Diff_n with each other that are output from the fluctuation prediction circuits 11 corresponding to the respective semiconductor circuits 10 and determines a priority order of the semiconductor circuits from the largest down to the smallest in terms of the values Diff_n. The priority order determined by the order circuit 40 is inputted to the order determination register 41. The order circuit 40 is one example of the order setting circuit.

Each differentiating circuit 42 differentiates the alarm signal ALM_n output from the monitor circuit 10a of the semiconductor circuit 10 corresponding thereto respectively, and outputs a signal pulse at timing when the alarm signal ALM_n rises for the first time. Accordingly, the differentiating circuit 42 outputs the pulse signal at a point of time when the output of any one of the two comparison circuits 23, 24 included in the monitor circuit 10a becomes an H-level, however, the input to the differentiating circuit 42 is thereafter kept at the H-level, and hence the pulse signal is not output any more.

The OR circuit 43 outputs a logical sum (OR) of the output of each differentiating circuit 42, however, the plural differentiating circuits 42 do not output the pulse signals simultaneously because of the plurality of semiconductor circuits 10 not being electrified simultaneously except when the initial setting is done, and the OR circuit 43 may therefore be replaced by a general type of OR circuit 43. An output terminal of the OR circuit 43 is connected to an enable terminal of the order determination register 41. The components other than the monitor transistor 20 in each monitor circuit 10a, and the differentiating circuit 42 and the OR circuit 43 in the order determination circuit 12, which have been described so far, are given by way of one example of the monitor circuit.

The order determination register 41 is a shift register that retains identification numbers of the respective semiconductor circuits 10 in order according to the priority order, inputted by the order circuit 40, of the semiconductor circuits and outputs the identification number of the top semiconductor circuit 10 (the semiconductor circuit 10 with the maximum variation) in the initial status. Thereafter, when the pulse signal is inputted to the enable terminal from the OR circuit 43, the order determination register 41 outputs the identification number of the next order. Hereafter, the identification numbers of the semiconductor circuits 10, which are output from the order determination register 41, are switched over according to the stored order each time the pulse signal is inputted to the enable terminal from the OR circuit 43. The identification number of the semiconductor circuit 10, which is output from the order determination register 41, is inputted to the semiconductor circuit selection decoder 44. The order determination register 41 is one example of an order setting unit.

The semiconductor circuit selection decoder 44 has n-pieces of output terminals connected respectively to the enable terminals of the semiconductor circuits 10, and outputs the enable signal from the output terminal connected to the semiconductor circuit 10 specified by the identification number inputted from the order determination register 41. The semiconductor circuit selection decoder 44 is one example of an electrification instruction circuit.

From what has been described so far, the order determination circuit 12 outputs the enable signal to the semiconductor circuit 10 (the semiconductor circuit 10 with the maximum variation) that is the top of the priority order in the initial status, and sets this semiconductor circuit 10 in the active status. Thereafter, when the life-time of the semiconductor circuit 10 expires and when the alarm signal ALM_n is output from the monitor circuit 10a of this semiconductor circuit, the order determination circuit 12 stops outputting the enable signal to the semiconductor circuit 10. Along with the stop of the enable signal to the semiconductor circuit 10, the order determination circuit 12 outputs the enable signal to the semiconductor circuit 10 (the semiconductor circuit 10 with the second largest variation) that is second in the priority order, and sets the latter semiconductor circuit 10 in the active status. Hereafter, each time the active semiconductor circuit 10 reaches the expiration of its life-time, the order determination circuit 12 goes on switching over the semiconductor circuits 10 supplied with the enable signals according to the priority order.

Figure 11:
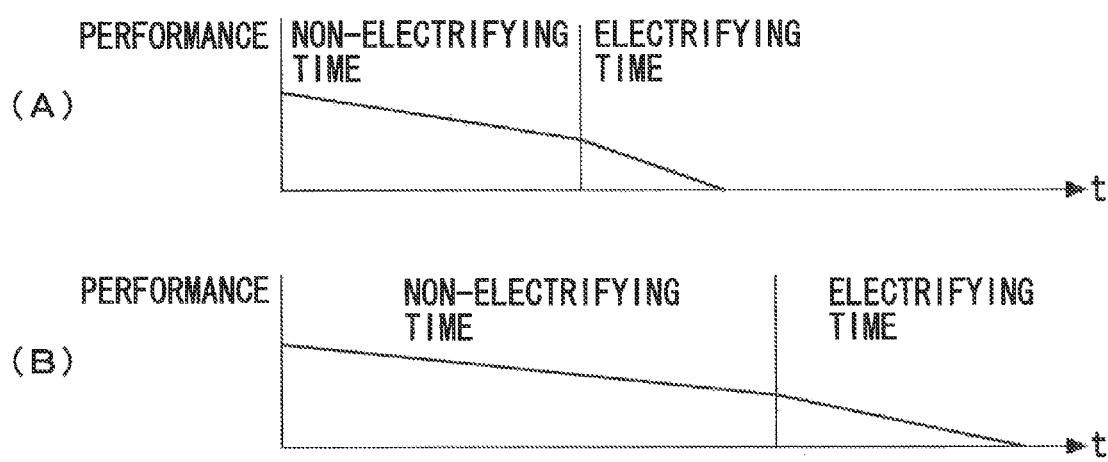
FIG. 11 is a graph depicting the transitions of the time-lapse fluctuations of an active element and a standby element in the case of being switched over according to an embodiment.
Figure 12:
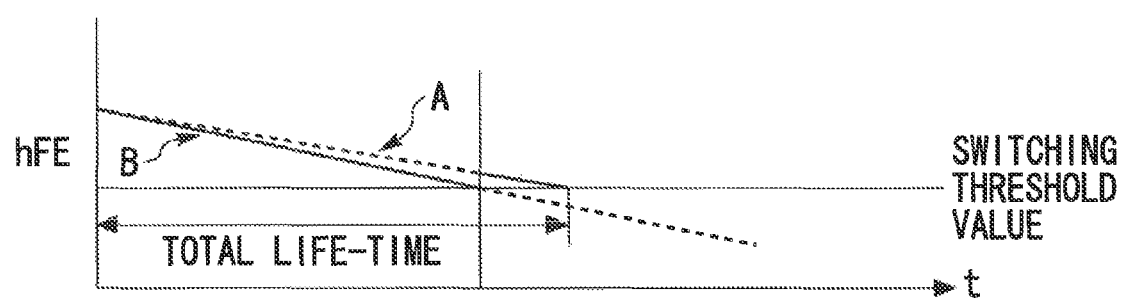
FIG. 12 is a graph depicting the transitions of the time-lapse fluctuations of the active element and the standby element in the case of being switched over in the order reversed to the order in FIG. 11.

With the mechanism described above, in advance of the system being actually used, there are measured electric characteristics of the monitor transistor (monitor unit) in the monitor circuit 10a formed integrally with each semiconductor circuit 10 (element). Then, the order of using the respective semiconductor circuits 10 (elements) is determined in the sequence from the largest down to the smallest in per-time variation of the measured electric characteristics. Subsequently, in the initial status, as illustrated in FIG. 9, the semiconductor circuit 10 (see FIG. 11(A)) having a characteristic of a deterioration speed being fast is initially determined to be active and is then electrified. Thereafter, each time a relationship in magnitude between a value of the electric characteristic of the semiconductor circuit 10 (element) being electrified and a predetermined threshold value is reversed, a standby semiconductor circuit 10 (see FIG. 11(a)) having a characteristic of the deterioration speed being slow is newly switched over to the active semiconductor circuit and then electrified. Accordingly, the semiconductor circuit 10 (element) predicted to be shorter in life-time due to the larger variation is electrified earlier and used, during which the semiconductor circuit 10 (element) predicted to be longer in life-time due to the smaller variation remains to be non-electrified, and hence the speed of the fluctuation of the characteristic is refrained. Accordingly, even at the point of time when the semiconductor circuit 10 (element) having the long life-time is electrified, this semiconductor circuit 10 (element) has still the sufficient life-time, and the life-time of the whole system can be therefore kept over a long period of time.

In FIG. 1, each semiconductor circuit 10 may also be packaged in the way of being integrated into one semiconductor element. That semiconductor element may be packaged with the fluctuation prediction circuit 11 and the order determination circuit 12.

In FIG. 1, each semiconductor circuit 10 may also be packaged on one printed board. That printed board may be packaged with the fluctuation prediction circuit 11 and the order determination circuit 12.

In the present example, the monitor circuit 10a measures the collector current Ic and the base current Ib, the fluctuation prediction circuit 11 calculates the per-time variation of the amplification ratio (hFE) defined as the ratio between the both current values, and the order determination circuit 12 determines the priority order of the respective semiconductor circuits 10 from the largest down to the smallest in terms of the variations. In the present example, however, the physical characteristic measured for predicting the time-lapse fluctuation of the semiconductor circuit 10 is not limited to the amplification ratio of the monitor transistor 20. For example, under the premise that the voltage of the power source is fixed and the time-lapse fluctuation of the base current Ib is small, the value itself of the corrector current Ic may be employed. In this case, it may be sufficient that the fluctuation prediction circuit 11 calculates the per-time variation of the collector current Ic. In short, it may be sufficient that the physical characteristic measured for predicting the time-lapse fluctuation of the semiconductor circuit 10 is a characteristic of which the measurement value changes along with the time-lapse fluctuation.

Note that the element other than the bipolar transistor may be substituted by the transistor 20 for the monitor as a monitor unit in a way that depends on the physical characteristic measured by the monitor circuit 10a. For example, a MOSFET (Metal-Oxide-Semiconductor Field-Effect Transistor) may be used as the monitor unit.

Moreover, in the present example, the monitor circuit 10a compares the collector current Ic and the base current Ib with the threshold value respectively and, if the currents Ic, Ib exceed the threshold value, emits the alarm signal (ALM_n). In the present example, however, the physical characteristic compared with the threshold value in order to emit the switching signal is not limited to the both currents Ic, Ib. For example, the amplification ratio (hFE) may be compared with the threshold value. Further, what mainly fluctuates due to the time-lapse fluctuation of the monitor transistor 20 is the collector current Ic, and hence only the collector current Ic may be compared with the threshold value. In short, the characteristic, of which the physical characteristic changes along with the time-lapse fluctuation, is available as the physical characteristic measured for actually measuring the time-lapse fluctuation of the semiconductor circuit 10. Furthermore, when the measurement value exceeds the threshold value, the alarm signal (ALM_n) may be output depending on the physical characteristic to be measured.

Moreover, in a light emitting element such as a light emitting diode and a semiconductor laser and in a light receiving element such as a photo diode and a photo transistor, an optical-physical property fluctuates depending on the time-lapse fluctuation. Similarly, also in an image capturing element such as a CCD image sensor and a MOS (Metal Oxide Semiconductor) image sensor, the optical-physical property fluctuates depending on the time-lapse fluctuation. Therefore, these optical semiconductor devices are redundantly configured, sequentially switched over and thus used, in which case a photo coupler configured by combining the light emitting element with the light receiving element is used as the monitor unit, and a variation of a detected current of the light receiving element (partially) configuring the photo coupler may also be measured. Even if the redundantly-configured element itself is not the optical semiconductor device, the monitor unit may involve using the optical semiconductor device such as the photo coupler.

Further, in the present example, the whole of the fluctuation prediction circuit 11 and the order circuit 40 in the order determination circuit 12 become useless after the priority order of the semiconductor circuits 10 has been set in the order determination register 41. Such being the case, the fluctuation prediction circuit 11 and the order circuit 40 are configured attachably and detachably to and from other circuit components and may be removed from the electronic system 1 after the priority order of the semiconductor circuits 10 has been set in the order determination register 41. In this case, e.g., if the priority order of the semiconductor circuits 10 is set in the order determination register 41 before being shipped from a factory of the electronic system 1, it follows that the electronic system 1 shipped from the factory includes neither the fluctuation prediction circuit 11 nor the order circuit 40. Whereas if the electronic system 1 is shipped in a state of including the fluctuation prediction circuit 11 and the order circuit 40, however, the priority order cannot be set in the order determination register 41 till the electronic system 1 is started for the first time, and it is therefore feasible to avoid the system from being affected by deterioration with a lapse of time till the startup is done after being shipped.

Moreover, in the present example, the priority order of the semiconductor circuits 10 is registered in the order determination register 41, so that the configuration of the order setting unit becomes simple. If the configuration is allowable though complicated, however, there may also be available, e.g., a mechanism of counting the number of switching signals output by the monitor circuit and reading an identification number of a function element from a memory on the basis of an address associated with a count value thereof.

Further, the present example has discussed the semiconductor circuit 10 as the redundantly configured element by way of the circuit included in the electronic system 1. The electronic system 1 is exemplified such as a control circuit for plant control, communication control, power control or machinery control, a power supply circuit, an information processing circuit, a signal processing circuit, a sensor, a storage device, a communication device and a display device.

According to the mechanism of the disclosure, the redundantly-configured elements can be switched over in such an order as to enable the life-time of the whole system to be maintained for the longest period of time.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A switching device of a semiconductor circuit to switch over an active semiconductor circuit by sequentially electrifying redundantly-configured semiconductor circuits, comprising:
   a monitor unit to be formed integrally with each of the semiconductor circuits;
   an order setting unit to undergo setting of an order of the semiconductor circuits in the sequence from the largest down to the smallest in per-time variation of a physical characteristic of each monitor unit;
   a monitor circuit to measure the physical characteristic of each monitor unit and output a switching signal when a relationship in magnitude between a value of the measured physical characteristic and a predetermined threshold value is reversed; and
   an electrification instructing circuit to electrify the semiconductor circuit with the top of order being set in the order setting unit in an initial status, to thereafter stop electrifying the semiconductor circuit electrified so far each time the monitor circuit outputs the switching signal and to electrify the semiconductor circuit with the next of order being set in the order setting unit.

2. The switching device of the semiconductor circuit according to claim 1, further comprising:
   a variation measuring circuit to measure the per-time variation of the physical characteristic of each monitor unit; and
   an order setting circuit to set an order of the semiconductor circuits in the order setting unit from the largest down to the smallest in variation with respect to the monitor unit that is measured by the variation measuring circuit.

3. The switching device of the semiconductor circuit according to claim 1, wherein the order setting unit is a shift register stored with pieces of identification information of the semiconductor circuits according to the order of the semiconductor circuits, and notifies the electrification circuit of the identification information of the semiconductor circuit being next in the order of the semiconductor circuits that is stored in the shift register each time the monitor circuit outputs the switching signal.

4. A switching method of a semiconductor circuit to switch over an active semiconductor circuit by sequentially electrifying redundantly-configured semiconductor circuits, comprising:
   measuring a per-time variation of a physical characteristic of a monitor unit formed integrally with each of the semiconductor circuits;
   determining an order of the semiconductor circuits in the sequence from the largest down to the smallest in measured variation with respect to the monitor unit;
   measuring the physical characteristic of each monitor unit;
   outputting a switching signal when a relationship in magnitude between a value of the measured physical characteristic and a predetermined threshold value is reversed; and
   electrifying the semiconductor circuit with the top of order in an initial status, thereafter stopping electrifying the semiconductor circuit electrified so far each time the switching signal is output, and electrifying the semiconductor circuit that is next in the order thereof.

* * * * *